United States Patent
Wenink (10) Patent No.: US 8,744,380 B2
(45) Date of Patent: Jun. 3, 2014

(54) UNIFIED FREQUENCY SYNTHESIZER FOR DIRECT CONVERSION RECEIVER OR TRANSMITTER

(75) Inventor: Brian C. Wenink, Rochester, NY (US)

(73) Assignee: Harris Corporation, Melbourne, FL (US)

(*) Notice: Subject to any disclaimer, the term of this patent is extended or adjusted under 35 U.S.C. 154(b) by 330 days.

(21) Appl. No.: 13/050,012

(22) Filed: Mar. 17, 2011

(65) Prior Publication Data

US 2012/0235709 A1 Sep. 20, 2012

(51) Int. Cl.
*H04B 1/40* (2006.01)

(52) U.S. Cl.
USPC .................. 455/118; 455/313; 455/323

(58) Field of Classification Search
USPC .......... 455/73, 76, 77, 550.1, 552.1, 553.1, 455/118, 130, 132, 180.1, 313, 314, 315, 455/323, 324, 91, 115.1
See application file for complete search history.

(56) References Cited

U.S. PATENT DOCUMENTS

| | | | | |
|---|---|---|---|---|
| 5,966,666 A * | 10/1999 | Yamaguchi et al. | ....... | 455/552.1 |
| 6,522,868 B1 * | 2/2003 | Stilwell | ........................... | 455/76 |
| 6,985,701 B2 | 1/2006 | Yoshida et al. | | |
| 7,324,789 B2 * | 1/2008 | Jensen | ............................ | 455/76 |
| 7,392,026 B2 * | 6/2008 | Alam et al. | ................ | 455/180.1 |
| 2007/0066262 A1 | 3/2007 | Mishra | | |
| 2007/0178869 A1 | 8/2007 | Park et al. | | |
| 2008/0132192 A1 | 6/2008 | Lim | | |

* cited by examiner

*Primary Examiner* — Thanh Le
(74) *Attorney, Agent, or Firm* — Fox Rothchild, LLP; Robert J. Sacco (57) ABSTRACT

Method and system for direct conversion receiver (100), transmitter (200), or transceiver (300) device. The device includes a single frequency synthesizer (102) generating a frequency synthesizer output signal. At least one frequency divider (110$_n$) is provided for generating a reduced frequency signal by selectively dividing the single frequency synthesizer output signal by an integer divisor value. Significantly, the device is configured to vary the reduced frequency signal so as to include every frequency the direct conversion communication device is designed to receive within a plurality of frequency bands by adjusting a frequency of the single synthesizer output signal and the divisor value.

20 Claims, 4 Drawing Sheets

Synthesizer Calculations

| div | Tune Range | | Band | Band RF | | $S_d = 2S_{LO}$ | | Freq. Range of $S_{fs}$ | |
|---|---|---|---|---|---|---|---|---|---|
| 1 | 1516.0 | 2088.0 | 700/800 | 758 | 870 | 1516 | 1740 | 1516 | 1740 |
| 2 | 758.0 | 1044.0 | UHF | 380 | 520 | 760 | 1040 | 1520 | 2080 |
| 6 | 252.7 | 348.0 | VHF-HI | 136 | 174 | 272 | 348 | 1632 | 2088 |

FIG. 4

LMR and Military Band Coverage with 1516 – 2088 MHz VCO

| div | Tune Range ($S_d$) | | RF Range ($S_{RF}$) | | Band RF | Band |
|---|---|---|---|---|---|---|
| 1 | 1516.0 | 2088.0 | 758.00 | 1044 | 758-870 | 700/800 |
| 2 | 758.0 | 1044.0 | 379.00 | 522 | 380-520 | LMR UHF |
| 3 | 505.3 | 696.0 | 252.67 | 348 | | Mil UHF |
| 4 | 379.0 | 522.0 | 189.50 | 261 | 220-222 | LMR 220 / Mil UHF |
| 6 | 252.7 | 348.0 | 126.33 | 174 | 136-174 | LMR VHF-HI |
| 10 | 151.6 | 208.8 | 75.80 | 104.4 | 87-88 | MIL-VHF |
| 12 | 126.3 | 174.0 | 63.17 | 87 | 63-87 | MIL-VHF |
| 16 | 94.8 | 130.5 | 47.38 | 65.25 | 50-65 | MIL-VHF |
| 20 | 75.8 | 104.4 | 37.90 | 52.2 | 40-50 | MIL\LMR-VHF |
| 26 | 58.3 | 80.3 | 29.15 | 40.15385 | 30-40 | MIL\LMR-VHF |

FIG. 5

30-512 MHz coverage with 512-1024 VCO

| div | Tune Range ($S_d$) | | RF Range ($S_{RF}$) | |
|---|---|---|---|---|
| 1 | 512.0 | 1024.0 | 256 | 512 |
| 2 | 256.0 | 512.0 | 128 | 256 |
| 4 | 128.0 | 256.0 | 64 | 128 |
| 8 | 64.0 | 128.0 | 32 | 64 |
| 16 | 32.0 | 64.0 | 16 | 32 |

FIG. 6

30-2000 MHz coverage with 1920-4000 MHz VCO

| div | Tune Range ($S_d$) | | RF Range ($S_{RF}$) | |
|---|---|---|---|---|
| 1 | 1920.0 | 4000.0 | 1000 | 2000 |
| 2 | 960.0 | 2000.0 | 500 | 1000 |
| 4 | 480.0 | 1000.0 | 250 | 500 |
| 8 | 240.0 | 500.0 | 125 | 250 |
| 16 | 120.0 | 250.0 | 62.5 | 125 |
| 32 | 60.0 | 125.0 | 30 | 62.5 |

UNIFIED FREQUENCY SYNTHESIZER FOR DIRECT CONVERSION RECEIVER OR TRANSMITTER

STATEMENT OF THE TECHNICAL FIELD

The inventive arrangements relate to methods and systems for communication devices, and more particularly to systems and methods for frequency conversion in radio frequency communication devices.

DESCRIPTION OF THE RELATED ART

Frequency synthesizers are commonly used to generate local oscillator signals used in radio frequency conversion operations. For example, these signals can be used in mixers to perform up-conversion and down-conversion of signals. In portable radios, the frequency synthesizer section of the Radio Frequency (RF) module is often the largest and the most expensive portion of the design. Multiband frequency synthesizers for radios that operate on multiple bands are often larger and more complex than synthesizers for band specific radios. One option to support multiband transceiver functionality is to use a frequency synthesizer that can tune over a very broad range of frequencies sufficient cover all of the bands. This approach has the advantage of requiring only one synthesizer, but such designs are necessarily more complex. For example, they often require offset loops, broad band networks, high tuning voltages and so on. Moreover, the performance of a very broad tuning synthesizers are generally inferior to synthesizers that tune over a more narrow range.

An alternative approach to a single synthesizer that tunes over a very broad range of frequencies involves use of multiple synthesizers, each capable of tuning over a relatively narrow band of frequencies. The advantage of the multiple frequency synthesizer approach is that performance is not compromised in the way that it is with very broad tuning synthesizers. However, these multiple frequency synthesizer designs tend to be expensive, as each additional frequency synthesizer adds cost to the system. Use of multiple frequency synthesizers typically also involves more research and development effort and added time to market, since frequency synthesizers tend to be complex designs. Another problem with the multiple synthesizer approach is that more space is needed to fit the additional synthesizer units. This can be a significant issue in a portable radio design. Finally, the multiple synthesizer approach usually requires the addition of a band switching network to route the synthesized RF signal for the various RF frequency bands to the appropriate frequency conversion circuitry.

SUMMARY OF THE INVENTION

The invention concerns a method and system for providing a single RF synthesizer with a strategically selected tune range and a divider network to permit direct conversion coverage of all of the relevant bands of a land mobile radio (LMR) or other types of radio. The method involves generating a first signal $S_{fs}$ using a frequency synthesizer having a predetermined synthesizer tuning range. A second signal $S_d$ is generated which can have any one of a several different predetermined second tuning ranges. The second signal is generated by selectively performing a frequency dividing operation on the first signal in accordance with any one of a plurality of predetermined integer divisor values. The second signal is then used in a modulator or demodulator to perform a frequency conversion operation on a third signal. The frequency conversion can include a direct conversion from a frequency of a received or transmitted RF signal, to or from a baseband signal. In some embodiments, the frequency conversion includes quadrature modulation or quadrature demodulation of a signal.

The invention also concerns a communication device which includes a frequency synthesizer. The frequency synthesizer generates a first signal $S_{fs}$ within a predetermined synthesizer tuning range of the frequency synthesizer. A divider module is provided to selectively generate a second signal $S_d$ having any one of a plurality of predetermined second tuning ranges. The divider module is configured to generate the second tuning ranges by selectively performing a frequency dividing operation on the first signal in accordance with any one of a plurality of predetermined divisor values. A frequency conversion device is included in the communication device. The frequency conversion device can include a modulator or demodulator and is configured to use the second signal to perform a frequency conversion operation on a third signal. In some embodiments, the frequency conversion device is configured to directly convert a frequency of a received or transmitted RF signal, to or from a baseband signal. The frequency conversion device can be a quadrature modulator or quadrature demodulator.

According to yet another aspect, the invention concerns a direct conversion communication device. The device includes a single frequency synthesizer generating a frequency synthesizer output signal. At least one frequency divider is provided for generating a reduced frequency signal by selectively dividing the single frequency synthesizer output signal by an integer divisor value. Significantly, the device is configured to vary the reduced frequency signal so as to include every frequency the direct conversion communication device is designed to receive within a plurality of frequency bands. This is accomplished in the device by adjusting a frequency of the single synthesizer output signal and the divisor value.

BRIEF DESCRIPTION OF THE DRAWINGS

Embodiments will be described with reference to the following drawing figures, in which like numerals represent like items throughout the figures, and in which.

DETAILED DESCRIPTION

The present invention is described with reference to the attached figures, wherein like reference numbers are used throughout the figures to designate similar or equivalent elements. The figures are not drawn to scale and they are provided merely to illustrate the present invention. Several aspects of the invention are described below with reference to example applications for illustration. It should be understood that numerous specific details, relationships, and methods are set forth to provide a full understanding of the invention. One having ordinary skill(s) in the relevant art, however, will readily recognize that the invention can be practiced without one or more of the specific details or with other methods. In other instances, well-known structures or operation are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

The invention concerns a method and system by which an RF synthesizer with a selected tune range facilitates direct conversion coverage of all of the relevant bands of a radio device. Modern LMR radios are expected to provide direct conversion coverage for the several bands of frequencies including (1) VHF band: 136-174 MHz, (2) the 220 MHz band: 220-222 MHz, (3) UHF band: 380-520 MHz, (4) 700/800 MHz band: 762-870 MHz, hereinafter "the LMR bands." Radios used by the military can include these as well as other bands. The output of an RF synthesizer is coupled to a divider network that allows the limited frequency range output of the synthesizer to be converted to the tuning ranges that are necessary for direct conversion of all of the LMR or military bands. A single RF synthesizer can therefore be used to facilitate transmit and receive processing of all such bands. Advantageously, only a single phase locked loop is required for the design, and the loop runs at the tune frequency, not the output frequency. The dividers used in the present invention can be implemented as hardware or software.

Figure 1:
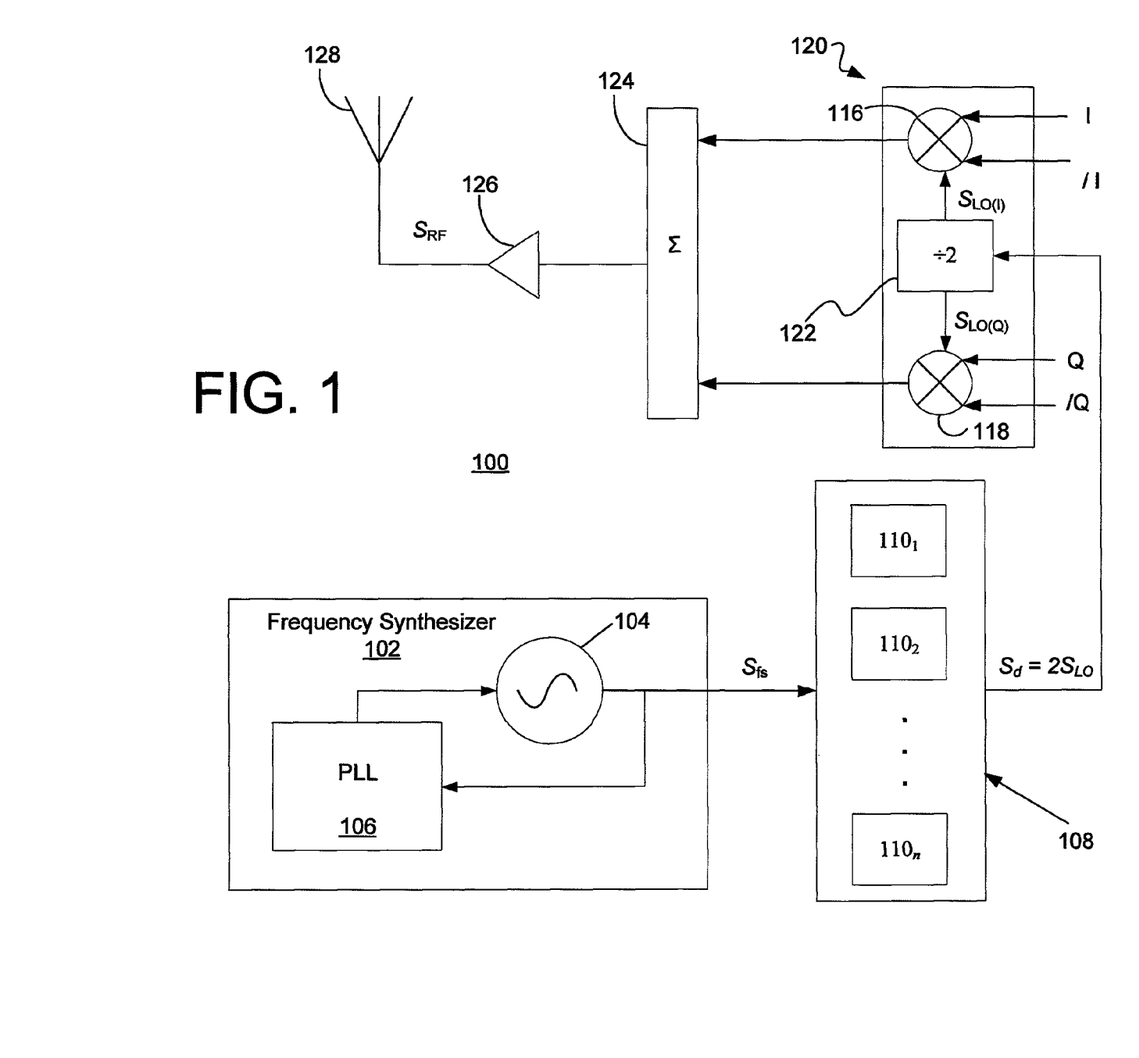
FIG. 1 is a block diagram of a transmitter which is useful for understanding the present invention.

Referring now to FIG. 1, there is shown a direct conversion type transmitter circuit 100 which includes a frequency synthesizer 102, a divider module 108, a modulator 120, and a summer 124. In RF communication systems, a direct conversion transmitter is one in which a baseband modulation signal is directly converted to a frequency of a desired transmitter RF output carrier signal. This generally requires that a signal used for RF mixing (sometimes called a local oscillator signal) is synchronized in frequency to the desired transmitter RF output carrier signal. An advantage of the direct conversion transmitter is that it requires only one stage of up-conversion or mixing. The direct conversion approach also reduces the number of filters that are required.

In the direct conversion transmitter in FIG. 1, the frequency synthesizer 102 generates a an RF signal which can be varied over a range of frequencies. The output of the frequency synthesizer is communicated to the divider module 108 which reduces the frequency of the RF signal in accordance with some integer divisor value. For example, if a divisor value of two is selected, the divider module will provide an output frequency which is half the RF frequency of the frequency synthesizer 102. The output of the divider module 108 is communicated to the modulator 120.

The modulator will typically perform two functions. It will modulate the RF carrier signal from the divider module in accordance with some predetermined transmitter modulation format and will convert an input signal at baseband frequency, to a transmitter carrier frequency. In the embodiment shown, an I/Q modulator is used for this purpose. The I/Q input values comprise a baseband signal which is converted directly to a transmitter carrier frequency by the modulator 120. The modulator performs a frequency conversion on the baseband signal to produce in-phase and quadrature-phase signals at the carrier frequency. These in-phase and quadrature phase signals are combined in the summer 124 to generate a low power transmit signal at the carrier frequency. A power level of this low-power transmit signal is increased in an amplifier 126 to produce a high power transmit signal, which is then communicated to an antenna 128. Notably, the direct conversion transmitter can have more or fewer components than those illustrated in FIG. 1. However, the components shown are sufficient to disclose an illustrative embodiment implementing the present invention.

Frequency synthesizers are well known in the art and frequency synthesizer 102 will not be described here in detail so as to avoid obscuring the invention. In general, however, the frequency synthesizer 102 will include a phase locked loop (PLL) 106 and a voltage controlled oscillator (VCO) 104. The frequency synthesizer 102 can produce a particular output frequency within a predetermined tuning frequency range in response to one or more control signal inputs (not shown). Advantageously, unlike the operation of multiple VCOs to implement multiple bands of operation, only a single phase locked loop is required for the design. The loop runs at the tune frequency of the single VCO, while the output local oscillator signal can be changed based on the selected divide ratio. In some embodiments, the PLL 106 can be an integer-N type PLL. Alternatively, if reduced phase noise is desired, a fractional-N type PLL device can be advantageously used instead. Still, it should be understood that any suitable frequency synthesizer design can be used for the present invention, provided that the frequency synthesizer is capable of producing a synthesized output frequency in the necessary ranges described below. For convenience, the output of the frequency synthesizer shall be referred to herein as $S_{fs}$.

The output of the frequency synthesizer is communicated to a divider module 108. The divider module 108 provides a plurality of frequency dividers $110_1, 110_2, \ldots 110_n$ which are capable of accepting an input signal of frequency $f_{in}$ and generating an output frequency $f_{out}=f_{in}/n$ where the divisor n is an integer. Frequency dividers are well known in the art. Accordingly, frequency dividers $110_1, 110_2, \ldots 110_n$ will not be described in detail in order to avoid obscuring the invention. However, it should be understood that any type of frequency divider can be used with the present invention provided that it is capable of performing frequency division as described herein. Frequency dividers used with the present invention can be analog or digital devices. For example, the frequency divider can be regenerative frequency divider, an injection-locked frequency divider, or a digital frequency divider. The frequency dividers can be implemented in hardware, software, or a combination of hardware and software. In some instances, one or more frequency dividers $110_1$, $110_2, \ldots 110_n$ can be implemented as a single frequency divider that is selectively configurable to perform frequency dividing operations for several different value of n. Alternatively, a plurality of frequency dividers can be used for this purpose, in which case suitable switching circuitry can be provided in divider module 108 to selectively route signals to and from each divider. For convenience, the signal output from the divider module shall be referred to herein as $S_d$.

The output of the divider module $S_d$ is communicated to I/Q modulator 120. A modulator is a device which accepts a baseband input signal and outputs a radio frequency (RF) modulated signal. As used herein, the term baseband refers to a signal that includes frequencies that range from very close to zero (0) hertz to some cut-of frequency, which usually is a maximum bandwidth of a signal. Baseband signals are often used to modulate a higher frequency carrier wave in order that it may be transmitted by radio. The low frequency components comprising the baseband signal are used in such instances to modulate the higher frequency carrier wave signal (an RF signal) in accordance with a modulation scheme.

Alternatively, a baseband signal can be extracted from a higher frequency signal (an RF signal) using a demodulator.

In the present invention, the modulator 120 can be any suitable type of modulator device. However, according to some embodiments, the modulator 120 can be an I/Q type modulator which facilitates quadrature amplitude modulation (QAM) methods. If the modulator 120 is an I/Q type modulator, it will generally include a phase splitter 122. In some embodiments, the phase splitter 122 can be a polyphase filter that generates the quadrature signals used to drive a pair of mixers 116, 118, which are also sometimes referred to as multipliers. However, polyphase filters have a limited bandwidth and it can therefore be advantageous to instead use a digital circuit to implement a broadband phase splitter. Such digital circuits used to implement broadband phase splitters are well known in the art and therefore will not be described here in detail. However, they essentially consist of D-type flip-flops and an inverter which are configured to produce precise quadrature outputs.

While digital circuits used to implement broadband phase splitters can advantageously permit excellent quadrature signal generation over a multi-octave frequency range, they do require an input frequency which is twice the desired local oscillator frequency (commonly referred to as 2*LO). FIG. 1 shows an embodiment of the invention that uses a 2*LO input to produce a desired local oscillator signal $S_{LO(I)}$, $S_{LO(Q)}$ that has the desired local oscillator frequency. Still, it should be appreciated that the invention is not limited in this regard and other types of phase splitters can also be used with the present invention.

Of course, if the phase splitter selected does not require 2*LO as an input, then the frequency of $S_{fs}$ and/or $S_d$ must be adjusted as necessary to produce a desired local oscillator frequency. More particularly, if the quadrature LO generation method does not involve a phase splitter that incorporates a frequency divide-by-2 element, the divide ratios chosen to implement a particular frequency plan would shift lower by a factor of two so as to result in the appropriate LO frequency for the conversion. Similarly, the frequency of the 2*LO tune range can be increased with a corresponding increase in the required divide ratios, such as doubling the 2*LO frequency, yielding 4*LO, and correspondingly increasing the divide ratios by a factor of two so as to obtain the same desired tune ranges.

Within the modulator 120, the above-described operation of phase splitter 122 will reduce the frequency of signal $S_d$ by ½ to obtain $S_{LO(I)}$, $S_{LO(Q)}$, which is applied to each of the mixers 116, 118. Note that the phase of $S_{LO(I)}$ applied to mixer 116 is offset 90° relative to the phase of $S_{LO(Q)}$ applied to mixer 118 such that the two signals are in quadrature. The signal $S_{LO}$ is applied to mixers 116, 118 to produce analog I and Q component output signals. These component signals are combined in summer 124 to obtain $S_{RF}$ (which has the same frequency as $S_{LO(I)}$, $S_{LO(Q)}$. The mixers 116, 118 can be thought of as multipliers that are respectively driven by fixed vectors that are separated by a phase angle of 90°. The fixed vector inputs to the mixers are defined by $S_{LO(I)}$, $S_{LO(Q)}$. Because the outputs of the two mixers are combined in summer 124, the I/Q signals applied to their second input (the I and Q inputs) provides the ability to generate arbitrary RF vectors in which the instantaneous phase and amplitude is strictly controlled. Finally, $S_{RF}$ can be amplified in RF amplifier 126 before being fed to antenna 128. A typical transmitter will also include one or more RF filters (not shown) to filter $S_{RF}$ before the signal is communicated to the antenna. Additional filters can be provided to filter $S_d$. Low pass filters (not shown) can also be used to filter the I, Q outputs. However, these filters are omitted in FIG. 1 because they are not critical to an understanding of the present invention.

Figure 2:
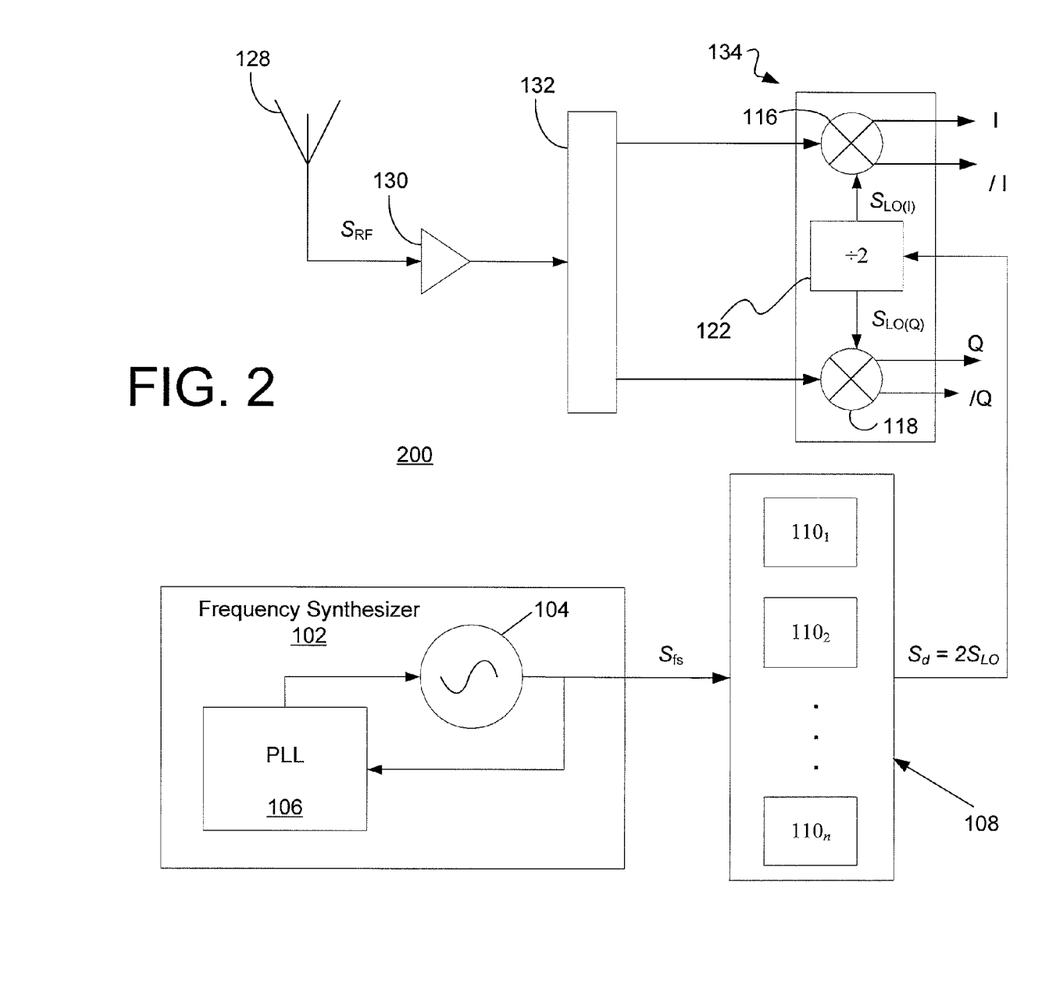
FIG. 2 is a block diagram of a receiver that is useful for understanding the present invention.

Those skilled in the art will appreciate that a direct conversion receiver is similar to the direct conversion transmitter described in FIG. 1. In a direct conversion receiver, a received signal is demodulated by mixing it with a local oscillator signal which is synchronized with the carrier frequency of the desired receive signal. The desired modulation signal is obtained immediately by low-pass filtering the output of a single mixer stage. Referring now to FIG. 2, there is shown a drawing of a direct conversion receiver 200 which is useful for understanding the invention. It can be observed that direct conversion receiver 200 is similar to direct conversion transmitter 100, and like components in FIG. 2 are identified using the same reference numbers as in FIG. 1. In FIG. 2, signals received by antenna 128 can be amplified by low noise amplifier 130 before being coupled to a signal splitter 132. Thereafter, the signals from splitter 132 are communicated to demodulator 134, which in some embodiments can be an I/Q modulator for performing QAM demodulation. If the demodulator 134 is an I/Q demodulator, it includes mixers 116, 118 which directly convert a received signal $S_{RF}$ from an RF carrier frequency to a baseband output. The signal $S_d$ is generated and provided to the modulator 134 in the manner previously described with regard to transmitter 100. A typical receiver 200 will also include one or more RF filters (not shown) to filter $S_p$ before the signal is communicated to the splitter 132. Low pass filters (not shown) can also be used to filter the I, Q outputs. These filters are omitted in FIG. 3 because they are not critical to an understanding of the present invention.

Figure 3:
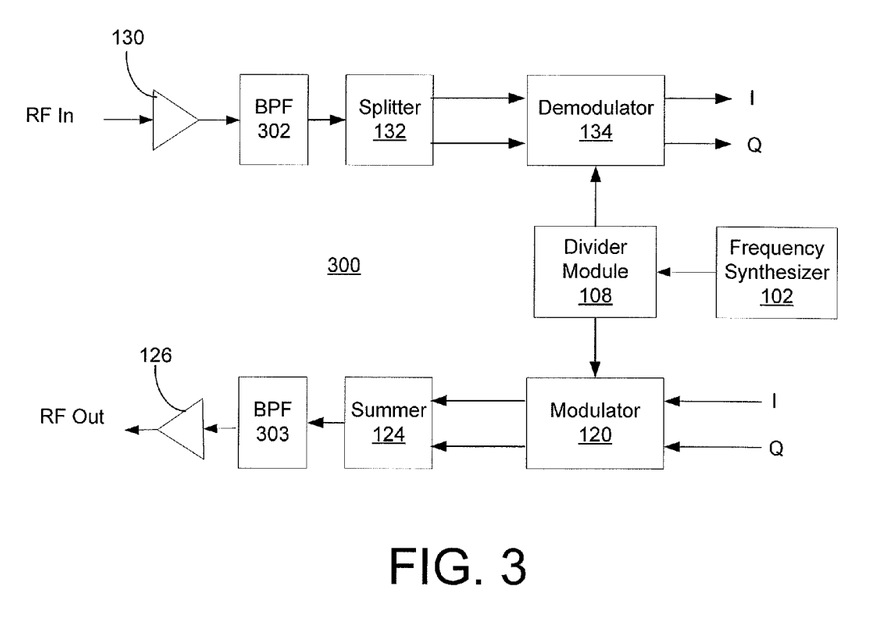
FIG. 3 is a block diagram of a transceiver that is useful for understanding the present invention.

Those skilled in the art will appreciate that the transmitter 100 and the receiver 200 can be combined in a single unit to form a transceiver 300 as shown in FIG. 3. Transceiver 300 operates in accordance with the descriptions of transmitter 100 and receiver 200 above, except that a common frequency synthesizer 102 and divider module 108 are used to facilitate receive and transmit operations. Note that in FIG. 3, one or more RF filters 302, 303 can be provided to filter RF signals. Low pass filters (not shown) can also be used to filter the I, Q outputs; however, these filters are omitted in FIG. 3 because they are not critical to an understanding of the present invention. Suitable antenna switching circuitry (not shown) can also be provided.

Figure 4:
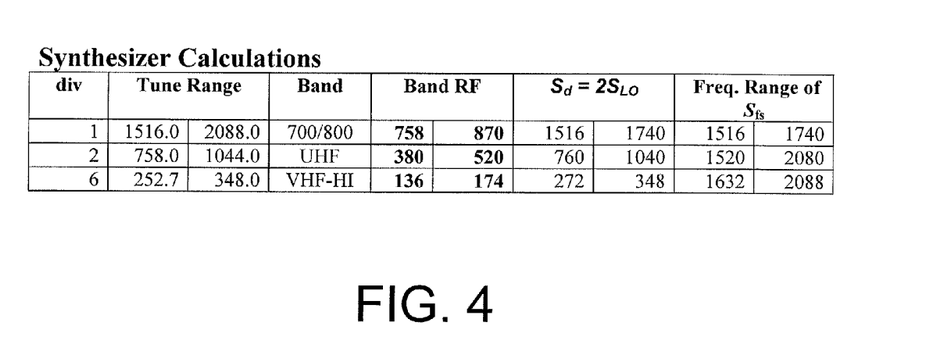
FIG. 4 is a table of synthesizer calculations that is useful for understanding the present invention.

Referring now to FIG. 4, there is provided a table that is useful for understanding how a single synthesizer having a tuning range of 1516 MHz-2088 MHz can be used to generate several of the local oscillator frequencies that are needed for covering several of the LMR bands. All frequencies in FIG. 4 are given in megahertz.

FIG. 4 shows that for the 700/800 MHz band, the RF frequencies of interest are 758 MHz to 870 MHz. This means that the necessary frequency range of $S_d = 2S_{LO}$ must be 1516 MHz to 1740 MHz (since the local oscillator frequency must be twice the RF frequency of interest in the embodiment of FIGS. 1-3). The frequency synthesizer 102 has an available tune range of 1516 MHz-2088 MHz. Accordingly, all of the of the required frequencies $S_d = 2S_{LO}$ between 1516 MHz to 1740 MHz for the 700/800 MHz band are directly available within the tune range of the frequency synthesizer 102. In this situation, a divide by 1 frequency divider (e.g. 110₁) can be used to obtain $S_d = 2S_{LO}$.

For the UHF band, the RF frequencies of interest are 380 MHz to 520 MHz. This means that the necessary frequency range of $S_d = 2S_{LO}$ must be 760 MHz to 1040 MHz (since the local oscillator frequency must be twice the RF frequency of interest in the embodiment of FIGS. 1-3). The frequency synthesizer 102 has an available tune range of 1516 MHz-2088 MHz. Dividing by 2 gives a new tune range of 758.0 MHz to 1044 MHz. This means that the divider can potentially provide any value of $S_d$ within this range. The required frequencies $S_d=2S_{LO}$ between 760 MHz to 1040 MHz for the UHF band is within the new tune range and can therefore be provided by using the divider module 108. In this instance, a divide by 2 frequency divider (e.g. $110_2$) can be used to obtain $S_d=2S_{LO}$. More particularly, a divide by 2 frequency divider will provide $S_d=2S_{LO}$ between 760 MHz to 1040 MHz when the frequency of $S_{fs}$ is varied between 1520 MHz and 2080 MHz.

For the VHF-HI band, the RF frequencies of interest are 136 MHz to 174 MHz. This means that the necessary frequency range of $S_d=2S_{LO}$ must be 272 MHz to 348 MHz (since the local oscillator frequency must be twice the RF frequency of interest in the embodiment of FIGS. 1-3). The frequency synthesizer 102 has an available tune range of 1516 MHz-2088 MHz. Dividing by 6 gives a new tune range of 252.7 MHz to 348.0 MHz at the output of the divider module 108. This means that the divider can potentially provide any value of $S_d$ within this range. The required frequencies $S_d=2S_{LO}$ between 272 MHz to 348 MHz for the UHF band is within the new tune range and can therefore be provided by using the divider module 108. In this instance, a divide by 6 frequency divider (e.g. $110_n$) can be used to obtain $S_d=2S_{LO}$. More particularly, a divide by 6 frequency divider will provide $S_d=2S_{LO}$ between 272 MHz to 348 MHz when the frequency of $S_{fs}$ is varied between 1632 MHz and 2088 MHz.

Figure 5:
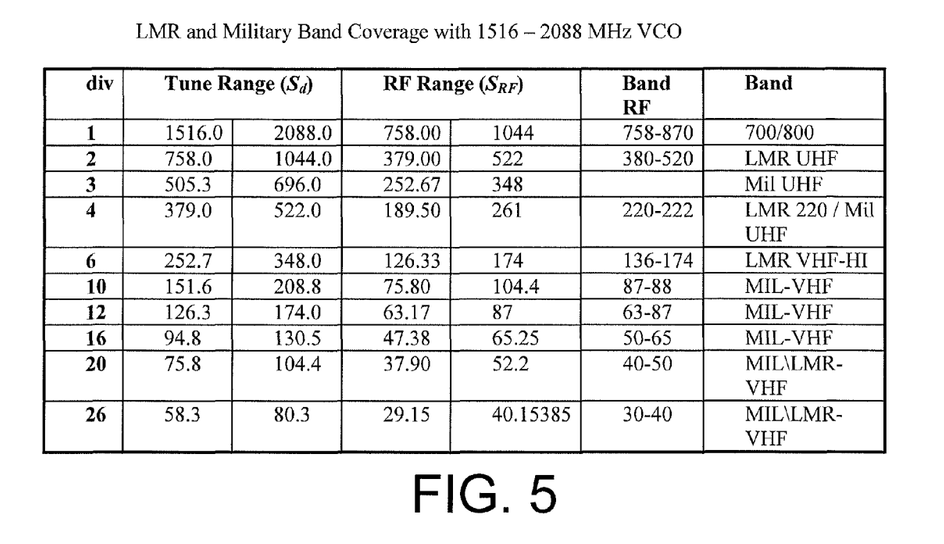
FIG. 5 is a table showing LMR and military band coverage with a 1516 MHz to 2088 MHz VCO.

FIG. 4 shows how a local oscillator signal for direct conversion of several LMR bands can be provided with a single frequency synthesizer. However, the invention is not limited to a direct conversion transmitter, receiver or transceiver for these frequency bands. FIG. 5 shows how other divide ratios can be used to obtain the necessary LO frequency for additional LMR bands using a single synthesizer which has a tune range of between 1516 MHz to 2088 MHz. In FIG. 5, all frequency values are in megahertz, but the information is presented in a somewhat different format as compared to FIG. 4. A "Tune Range" column is provided which lists the available tuning range for $S_d$ at the output of the divider module 108. However, a separate column is not included for showing frequency range of $S_{fs}$. Instead, a column labeled RF Range ($S_{RF}$) is provided which shows the possible range of frequencies of $S_{RF}$ that can be covered (for receive or transmit) using the applicable "Tune Range" frequencies. Note that the values listed for RF Range generally extend beyond the actual frequency ranges necessary for the various bands of interest as listed under the heading "Band RF."

FIG. 5 shows that a single frequency synthesizer having a tuning range of between 1516 MHz to 2088 MHz can be used in a direct conversion receiver, transmitter, or transceiver to cover a very wide variety of military and LMR bands as shown. For example, this arrangement can be used to cover all of the LMR bands (including the 220 MHz public safety band), the military Single Channel Ground and Airborne Radio System (SINCGARS) bands between 30-88 MHz, the public safety VHF-LO band between 30-50 MHz, and most of the Mil-Air UHF (225-400) band which extends from 225-348 and 379-400.

Figure 6:
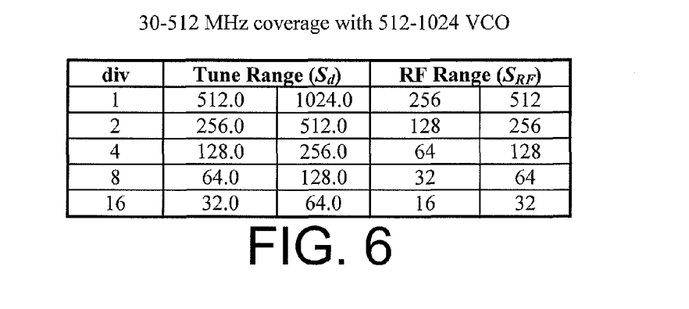
FIG. 6 is a table showing RF frequency coverage with a 512 MHz to 1024 MHz VCO.

Of course, the inventive arrangements are not limited to the frequencies or divide ratios described above. A similar approach can be used with frequency synthesizers having percentage bandwidth ratings that are larger or smaller than the ranges described above. In some embodiments, frequency synthesizers can be used that have a percentage bandwidth of 100% or more to provide frequency coverage over a wide range of frequencies. For example, FIG. 6 is a table that shows how a frequency synthesizer 102 could facilitate direct conversion receive or transmit operation over a continuous range of frequencies from 30 MHz to 512 MHz, using a synthesizer tuning range of 512 MHz to 1024 MHz, and divide ratios of 1, 2, 4, 8, and 16. As shown therein, such an arrangement will facilitate receive or transmit operation over a continuous RF range of frequencies extending from 16 MHz to 512 MHz.

Figure 7:
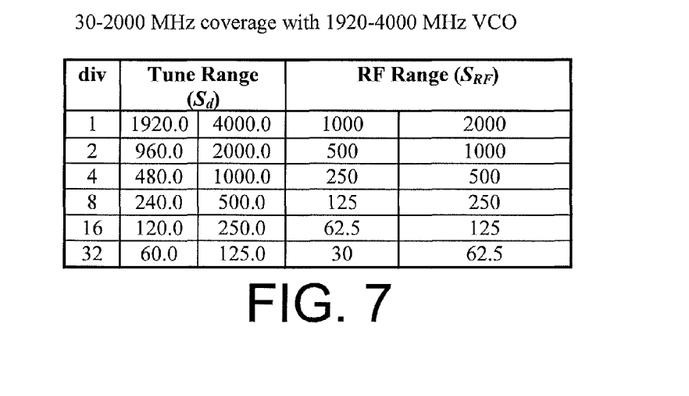
FIG. 7 is a table showing RF frequency coverage with a 1920 MHz to 4000 MHz VCO.

Similarly, FIG. 7 shows that a single frequency synthesizer 102 could facilitate direct conversion receive or transmit operation over a continuous range of frequencies from 30 MHz to 2000 MHz, using a synthesizer tuning range of 1920 MHz to 4000 MHz, and divide ratios of 1, 2, 4, 8, 16 and 32.

All of the apparatus, methods and algorithms disclosed and claimed herein can be made and executed without undue experimentation in light of the present disclosure. While the invention has been described in terms of preferred embodiments, it will be apparent to those of skill in the art that variations may be applied to the apparatus, methods and sequence of steps of the method without departing from the concept, spirit and scope of the invention. More specifically, it will be apparent that certain components may be added to, combined with, or substituted for the components described herein while the same or similar results would be achieved. All such similar substitutes and modifications apparent to those skilled in the art are deemed to be within the spirit, scope and concept of the invention as defined.

I claim:

1. A method for conversion of signals in a communication device, comprising:
    generating a first signal $S_{fs}$ using a frequency synthesizer having a predetermined synthesizer frequency tuning range which extends from about 1516 MHz to 2088 MHz;
    generating a second signal $S_d$ within any one of a plurality of predetermined second frequency tuning ranges, by selectively performing a first frequency dividing operation on said first signal in accordance with any one of a plurality of predetermined divisor values;
    communicating the second signal $S_d$ to a frequency conversion unit which includes a digital broadband phase splitter and a pair of mixers, including a first mixer and a second mixer;
    performing in said digital broadband phase splitter a second frequency dividing operation to produce first and second quadrature signals which have a phase offset of about 90°;
    communicating said first and second quadrature signals respectively to said first and second mixers; and
    using said first and second quadrature signals in each of said first and second mixer to modulate or demodulate a third signal by performing a frequency conversion operation on said third signal.

2. The method according to claim 1, wherein said plurality of predetermined divisor values consist of at least the divisor values 1, 2, and 6.

3. The method according to claim 1, wherein said plurality of predetermined divisor values consist of the divisor values 1, 2, 3, 4, 6, 10, 12, 16, 20 and 26.

4. The method according to claim 1, wherein said frequency conversion further comprises a direct conversion from a frequency of a received or transmitted RF signal, to or from a baseband signal.

5. The method according to claim 1, wherein said frequency conversion further comprises quadrature amplitude modulation or quadrature amplitude demodulation.

6. A method for conversion of signals in a communication device, comprising:
generating a first signal $S_{fs}$ using a frequency synthesizer having a predetermined synthesizer frequency tuning range which extends from about 512 MHz to 1024 MHz;
generating a second signal $S_d$ within any one of a plurality of predetermined second frequency tuning ranges, by selectively performing a first frequency dividing operation on said first signal in accordance with any one of a plurality of predetermined divisor values;
communicating the second signal $S_d$ to a frequency conversion unit which includes a digital broadband phase splitter and a pair of mixers, including a first mixer and a second mixer;
performing in said digital broadband phase splitter a second frequency dividing operation to produce first and second quadrature signals which have a phase offset of about 90°;
communicating said first and second quadrature signals respectively to said first and second mixers; and
using said first and second quadrature signals respectively in said first and second mixer to modulate or demodulate a third signal by performing a frequency conversion operation on said third signal.

7. The method according to claim 6, wherein said plurality of predetermined divisor values consist of the divisor values 1, 2, 4, 8, and 16.

8. A method for conversion of signals in a communication device, comprising:
generating a first signal $S_{fs}$ using a frequency synthesizer having a predetermined synthesizer frequency tuning range which extends from about 1920 MHz to 4000 MHz;
generating a second signal $S_d$ within any one of a plurality of predetermined second frequency tuning ranges, by selectively performing a first frequency dividing operation on said first signal in accordance with any one of a plurality of predetermined divisor values;
communicating the second signal $S_d$ to a frequency conversion unit which includes a digital broadband phase splitter and a pair of mixers, including a first mixer and a second mixer;
performing in said digital broadband phase splitter a second frequency dividing operation to produce first and second quadrature signals which have a phase offset of about 90°;
communicating said first and second quadrature signals respectively to said first and second mixers; and
using said first and second quadrature signals respectively in said first and second mixer to modulate or demodulate a third signal by performing second signal in a modulator or demodulator to perform a frequency conversion operation on said third signal.

9. The method according to claim 8, wherein said plurality of predetermined divisor values consist of the divisor values 1, 2, 4, 8, 16 and 32.

10. A method for conversion of signals in a communication device, comprising:
generating with a frequency synthesizer a synthesizer output signal $S_{fs}$ having a first frequency which is selectively variable from about 1516 MHz to 2088 MHz;
generating a second signal $S_d$ by selectively performing a first frequency dividing operation on said first signal in accordance with a selected one of a plurality of predetermined divisor values consisting of the divisor values 1, 2, 3, 4, 6, 10, 12, 16, 20 and 26;
communicating the second signal $S_d$ to a frequency conversion unit which includes a digital broadband phase splitter and a pair of mixers, including a first mixer and a second mixer;
performing in said digital broadband phase splitter a second frequency dividing operation to produce first and second quadrature signals which have a phase offset of about 90°;
communicating said first and second quadrature signals respectively to said first and second mixers; and
using said first and second quadrature signals in each of said first and second mixer to modulate or demodulate a third signal by performing a frequency conversion operation on said third signal.

11. A communication device, comprising:
a frequency synthesizer operable to generate a first signal $S_{fs}$ within a predetermined synthesizer frequency tuning range of said frequency synthesizer;
a divider module configured to selectively generate a second signal $S_d$ having any one of a plurality of predetermined second frequency tuning ranges, said divider module configured to selectively perform a first frequency dividing operation on said first signal in accordance with any one of a plurality of predetermined divisor values;
a frequency conversion device which includes a digital broadband phase splitter and a pair of mixers, including a first mixer and a second mixer, said frequency conversion device configured to receive the second signal $S_d$ from said divider module;
wherein said digital broadband phase splitter is configured to perform a second frequency dividing operation using only one divisor value to produce first and second quadrature signals which have a phase offset of about 90°;
wherein said frequency conversion device is configured to use said first and second quadrature signals in each of said first and second mixer to perform a frequency conversion operation on a third signal; and
wherein said predetermined synthesizer frequency tuning range extends from about 1516 MHz to 2088 MHz.

12. The method according to claim 11, wherein said plurality of predetermined divisor values consist of at least the divisor values 1, 2, and 6.

13. The communication device according to claim 11, wherein said plurality of predetermined divisor values consist of the divisor values 1, 2, 3, 4, 6, 10, 12, 16, 20 and 26.

14. The communication device according to claim 11, wherein said frequency conversion device is configured to directly convert a frequency of a received or transmitted RF signal, to or from a baseband signal.

15. The communication device according to claim 11, wherein said frequency conversion device is a quadrature amplitude modulator or quadrature amplitude demodulator.

16. A communication device, comprising:
a frequency synthesizer operable to generate a first signal $S_{fs}$ within a predetermined synthesizer frequency tuning range of said frequency synthesizer;
a divider module configured to selectively generate a second signal $S_d$ having any one of a plurality of predetermined second frequency tuning ranges, said divider module configured to selectively perform a first frequency dividing operation on said first signal in accordance with any one of a plurality of predetermined divisor values;
a frequency conversion device which includes a digital broadband phase splitter and a pair of mixers, including a first mixer and a second mixer, said frequency conversion device configured to receive the second signal $S_d$ from said divider module;

wherein said digital broadband phase splitter is configured to perform a fixed second frequency dividing operation using only one divisor value to produce first and second quadrature signals which have a phase offset of about 90°;

wherein said frequency conversion device is configured to use said first and second quadrature signals in each of said first and second mixer to perform a frequency conversion operation on a third signal; and wherein said predetermined synthesizer tuning range extends from about 512 MHz to 1024 MHz.

17. The communication device according to claim 16, wherein said plurality of predetermined divisor values consist of the divisor values 1, 2, 4, 8, and 16.

18. A communication device, comprising:

a frequency synthesizer operable to generate a first signal $S_{fs}$ within a predetermined synthesizer frequency tuning range of said frequency synthesizer;

a divider module configured to selectively generate a second signal $S_d$ having any one of a plurality of predetermined second frequency tuning ranges, said divider module configured to selectively perform a first frequency dividing operation on said first signal in accordance with any one of a plurality of predetermined divisor values;

a frequency conversion device which includes a digital broadband phase splitter and a pair of mixers, including a first mixer and a second mixer, said frequency conversion device configured to receive the second signal $S_d$ from said divider module;

wherein said digital broadband phase splitter is configured to perform a second frequency dividing operation using only one divisor value to produce first and second quadrature signals which have a phase offset of about 90°;

wherein said frequency conversion device is configured to use said first and second quadrature signals in each of said first and second mixer to perform a frequency conversion operation on a third signal; and wherein said predetermined synthesizer frequency tuning range extends from about 1920 MHz to 4000 MHz.

19. The communication device according to claim 18, wherein said plurality of predetermined divisor values consist of the divisor values 1, 2, 4, 8, 16 and 32.

20. A direct conversion communication device comprising:

a single frequency synthesizer operable to generate a frequency synthesizer output signal having a frequency tuning range which extends from about 1516 MHz to 2088 MHz;

a first frequency divider configured for generating a reduced frequency signal, said frequency divider configured to selectively divide said single frequency synthesizer output signal by an integer divisor value selected from among a plurality of predetermined divisor values;

a frequency conversion device which includes a digital broadband phase splitter and a pair of mixers, including a first mixer and a second mixer, said frequency conversion device configured to receive the reduced frequency signal from said first frequency divider;

wherein said digital broadband phase splitter is configured to perform a frequency dividing operation to produce first and second quadrature signals which have a phase offset of about 90°;

wherein said first and second quadrature signals are variable to include every frequency said direct conversion communication device is designed to receive within a plurality of frequency bands by adjusting a frequency of said single synthesizer output signal and variably selecting one of said plurality of divisor values as said integer divisor value; and wherein said plurality of predetermined divisor values consist of at least the divisor values 1, 2, and 6.

* * * * *